(12) United States Patent
Khlat

(10) Patent No.: US 11,349,468 B2
(45) Date of Patent: May 31, 2022

(54) TARGET VOLTAGE CIRCUIT FOR FAST VOLTAGE SWITCHING

(71) Applicant: Qorvo US, Inc., Greensboro, NC (US)

(72) Inventor: Nadim Khlat, Cugnaux (FR)

(73) Assignee: QORVO US, INC., Greensboro, NC (US)

( * ) Notice: Subject to any disclaimer, the term of this patent is extended or adjusted under 35 U.S.C. 154(b) by 0 days.

(21) Appl. No.: 17/237,244

(22) Filed: Apr. 22, 2021

(65) Prior Publication Data

US 2022/0029614 A1 Jan. 27, 2022

Related U.S. Application Data

(60) Provisional application No. 63/056,051, filed on Jul. 24, 2020.

(51) Int. Cl.
  *H03K 17/042* (2006.01)
  *G05F 1/46* (2006.01)

(52) U.S. Cl.
  CPC ............ *H03K 17/042* (2013.01); *G05F 1/46* (2013.01)

(58) Field of Classification Search
  CPC .............................. H03K 17/042; G05F 1/46
  USPC ........................ 327/108–112; 326/82, 83, 87
  See application file for complete search history.

(56) References Cited

U.S. PATENT DOCUMENTS

| | | | |
|---|---|---|---|
| 8,159,309 B1 | 4/2012 | Khlat et al. | |
| 8,718,188 B2 | 5/2014 | Balteanu et al. | |
| 8,912,769 B2 | 12/2014 | Lin et al. | |
| 9,020,453 B2 | 4/2015 | Briffa et al. | |
| 9,069,365 B2 | 6/2015 | Brown et al. | |
| 9,148,090 B2 | 9/2015 | Tsuji | |
| 9,172,331 B2 | 10/2015 | Nagasaku et al. | |
| 9,231,527 B2 | 1/2016 | Hur et al. | |
| 9,350,299 B2 | 5/2016 | Tsuji | |
| 9,391,567 B2 | 7/2016 | Kaczman | |

(Continued)

OTHER PUBLICATIONS

Mellon, Laura, "Data Transmission—Parallel vs Serial", Jul. 10, 2017, https://www.quantil.com/content-delivery-insights/content-acceleration/data-transmission/ (Year: 2017).*

(Continued)

*Primary Examiner* — Tomi Skibinski
(74) *Attorney, Agent, or Firm* — Withrow & Terranova, P.L.L.C.

(57) ABSTRACT

A target voltage circuit for fast voltage switching is provided. The target voltage circuit is configured to generate a time-variant target voltage(s) to thereby cause a power management circuit to generate a time-variant voltage(s) for a power amplifier circuit. In embodiments disclosed herein, the target voltage circuit receives a number of data signals (e.g., from a transceiver circuit via a parallel bus) that collectively represent a digital target voltage word and maps the digital target voltage word to a target voltage(s). By receiving the digital target voltage word corresponding to the target voltage(s) via the parallel bus, as opposed to directly receiving the target voltage(s) via a serial bus, it is possible to reduce transmission delay. As a result, the power management circuit will be able to switch the time-variant voltage(s) from one voltage level to another based on the target voltage(s) within a defined temporal limit.

20 Claims, 5 Drawing Sheets

(56) References Cited

U.S. PATENT DOCUMENTS

| | | | |
|---|---|---|---|
| 9,407,476 B2 | 8/2016 | Lim et al. | |
| 9,496,828 B2 | 11/2016 | Ye | |
| 9,614,477 B1 | 4/2017 | Rozenblit et al. | |
| 9,634,560 B2 | 4/2017 | Ek | |
| 10,097,145 B1 | 10/2018 | Khlat et al. | |
| 10,142,074 B2 | 11/2018 | Wang et al. | |
| 10,243,524 B2 | 3/2019 | Orr | |
| 10,778,094 B2 | 9/2020 | de Cremoux | |
| 10,862,428 B2 | 12/2020 | Henzler et al. | |
| 11,223,325 B2 | 1/2022 | Drogi et al. | |
| 2003/0099230 A1* | 5/2003 | Wenk | H04J 3/0685 370/366 |
| 2004/0179382 A1* | 9/2004 | Thaker | H02J 1/08 363/74 |
| 2014/0312710 A1 | 10/2014 | Li | |
| 2018/0257496 A1 | 9/2018 | Andoh et al. | |
| 2019/0109566 A1 | 4/2019 | Folkmann et al. | |
| 2019/0334750 A1 | 10/2019 | Nomiyama et al. | |
| 2021/0175798 A1 | 6/2021 | Liang | |

OTHER PUBLICATIONS

U.S. Appl. No. 17/182,539, filed Feb. 23, 2021.
U.S. Appl. No. 17/217,594, filed Mar. 30, 2021.
U.S. Appl. No. 17/217,654, filed Mar. 30, 2021.
U.S. Appl. No. 17/316,828, filed May 11, 2021.
Non-Final Office Action for U.S. Appl. No. 17/325,482, dated Sep. 30, 2021, 10 pages.
Non-Final Office Action for U.S. Appl. No. 17/315,652, dated Sep. 2, 2021, 7 pages.
Non-Final Office Action for U.S. Appl. No. 17/325,482, dated Mar. 15, 2022, 10 pages.
Non-Final Office Action for U.S. Appl. No. 17/315,652, dated Feb. 14, 2022, 12 pages.
International Search Report and Written Opinion for International Patent Application No. PCT/US2021/061721, dated Mar. 14, 2022, 13 pages.

* cited by examiner

TARGET VOLTAGE CIRCUIT FOR FAST VOLTAGE SWITCHING

RELATED APPLICATIONS

This application claims the benefit of provisional patent application Ser. No. 63/056,051, filed Jul. 24, 2020, the disclosure of which is hereby incorporated herein by reference in its entirety.

FIELD OF THE DISCLOSURE

The technology of the disclosure relates generally to a circuit for generating a target voltage for a power management circuit.

BACKGROUND

Fifth-generation (5G) new radio (NR) (5G-NR) has been widely regarded as the next generation of wireless communication technology beyond the current third-generation (3G) and fourth-generation (4G) technologies. In this regard, a wireless communication device capable of supporting the 5G-NR wireless communication technology is expected to achieve higher data rates, improved coverage range, enhanced signaling efficiency, and reduced latency across a wide range of radio frequency (RF) bands, which include a low-band (below 1 GHz), a mid-band (1 GHz to 6 GHz), and a high-band (above 24 GHz). Moreover, the wireless communication device may still support the legacy 3G and 4G technologies for backward compatibility.

In addition, the wireless communication device is also required to support local area networking technologies, such as Wi-Fi, in both 2.4 GHz and 5 GHz bands. The latest 802.11ax standard has introduced a dynamic power control feature to allow the wireless communication device to transmit a Wi-Fi signal with a maximum power ranging from −10 dBm to 23 dBm. Accordingly, a Wi-Fi power amplifier(s) in the wireless communication device must be able to adapt a power level of the Wi-Fi signal on a per-frame basis. As a result, a power management circuit must be able to adapt an average power tracking (APT) voltage supplied to the Wi-Fi power amplifier(s) within Wi-Fi inter-frame spacing (IFS) to help maintain linearity and efficiency of the Wi-Fi power amplifier(s).

Notably, the Wi-Fi IFS may only last sixteen microseconds (16 μs). Depending on specific configurations of the Wi-Fi system, such as bandwidth mode, trigger frame format, modulation and coding scheme (MCS), and delays associated with Wi-Fi physical layer (PHY) and communication buses, the actual temporal limit for the power management circuit to adapt the APT voltage(s) may be as short as one-half of a microsecond (0.5 μs). In this regard, it is desirable for the power management circuit to adapt the APT voltage(s) from one level to another within a defined temporal limit (e.g., 0.5 μs).

SUMMARY

Embodiments of the disclosure relate to a target voltage circuit for fast voltage switching. The target voltage circuit is configured to generate a time-variant target voltage(s) to thereby cause a power management circuit to generate a time-variant voltage(s), such as an average power tracking (APT) voltage, for a power amplifier circuit. In embodiments disclosed herein, the target voltage circuit receives a number of data signals (e.g., from a transceiver circuit via a parallel bus) that collectively represent a digital target voltage word and maps the digital target voltage word to a target voltage(s). By receiving the digital target voltage word corresponding to the target voltage(s) via the parallel bus, as opposed to directly receiving the target voltage(s) via a serial bus, it is possible to reduce transmission delay. As a result, the power management circuit will be able to switch the time-variant voltage(s) from one voltage level to another based on the target voltage(s) within a defined temporal limit.

In one aspect, a target voltage circuit is provided. The target voltage circuit includes a front-end circuit configured to receive a number of data signals collectively representing a digital target voltage word. The target voltage circuit also includes a processing circuit. The processing circuit is configured to determine a target voltage term based on the received digital target voltage word. The processing circuit is also configured to generate at least one target voltage based on the determined target voltage term.

In another aspect, a power management apparatus is provided. The power management apparatus includes a target voltage circuit. The target voltage circuit includes a front-end circuit configured to receive a number of data signals collectively representing a digital target voltage word. The target voltage circuit also includes a processing circuit. The processing circuit is configured to determine a target voltage term based on the received digital target voltage word. The processing circuit is also configured to generate at least one target voltage based on the determined target voltage term. The power management apparatus also includes a fast-switching power management circuit. The fast-switching power management circuit is configured to switch an average power tracking (APT) voltage between different voltage levels based on the at least one target voltage and within a defined temporal limit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
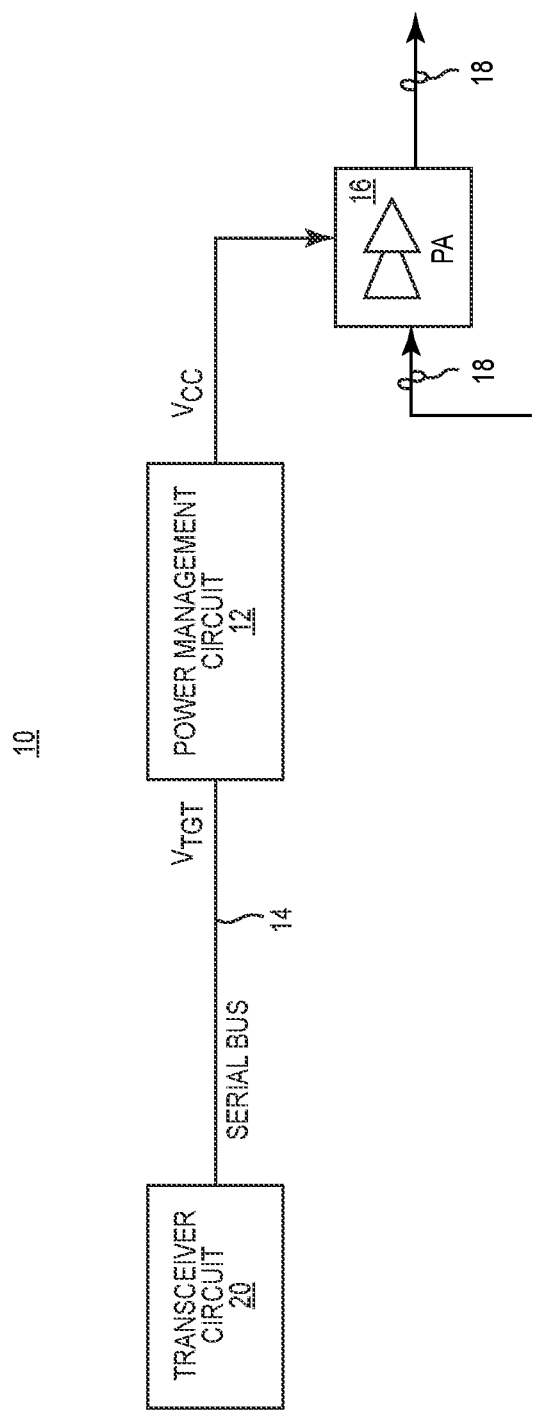
FIG. 1 is a schematic diagram of an exemplary conventional power management apparatus in which a power management circuit generates a time-variant voltage based on a time-variant target voltage received directly via a serial bus.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a target voltage circuit for fast voltage switching. The target voltage circuit is configured to generate a time-variant target voltage(s) to thereby cause a power management circuit to generate a time-variant voltage(s), such as an average power tracking (APT) voltage, for a power amplifier circuit. In embodiments disclosed herein, the target voltage circuit receives a number of data signals (e.g., from a transceiver circuit via a parallel bus) that collectively represent a digital target voltage word and maps the digital target voltage word to a target voltage(s). By receiving the digital target voltage word corresponding to the target voltage(s) via the parallel bus, as opposed to directly receiving the target voltage(s) via a serial bus, it is possible to reduce transmission delay. As a result, the power management circuit will be able to switch the time-variant voltage(s) from one voltage level to another based on the target voltage(s) within a defined temporal limit.

Before discussing specific embodiments of the target voltage circuit according to the present disclosure, starting at FIG. 2, a conventional power management apparatus is first discussed with reference to FIG. 1 to help understand a need to generate a target voltage(s) for a power management circuit with minimal delays.

In this regard, FIG. 1 is a schematic diagram of an exemplary conventional power management apparatus 10 in which a power management circuit 12 generates a time-variant voltage $V_{CC}$ based on a time-variant target voltage $V_{TGT}$ received directly via a serial bus 14. The power management circuit 12 is configured to provide the time-variant voltage $V_{CC}$, such as an average power tracking (APT) voltage, to a power amplifier circuit 16 (denoted as "PA") for amplifying a radio frequency (RF) signal 18.

In a non-limiting example, the RF signal 18 can be a Wi-Fi signal that is subject to dynamic power control. In this regard, the power management circuit 12 is required to adapt the time-variant voltage $V_{CC}$ within a defined temporal limit that can be as short as one-half of a microsecond (0.5 µs). Given that the power management circuit 12 is configured to adapt the time-variant voltage $V_{CC}$ in accordance with the time-variant target voltage $V_{TGT}$, it is understandable that the time the power management circuit 12 takes to receive the time-variant target voltage $V_{TGT}$ will be included in the defined temporal limit.

In the conventional power management apparatus 10, the power management circuit 12 receives the time-variant target voltage $V_{TGT}$ from a transceiver circuit 20 via the serial bus 14. In a non-limiting example, the serial bus 14 is an RF front-end (RFFE) bus that includes a single data line and operates based on a 52 MHz clock. In this regard, the serial bus 14 may take 23 clock cycles (approximately 0.44 µs) to convey a specific target voltage $V_{TGT}$ from the transceiver circuit 20 to the power management circuit 12. As a result, the power management circuit 12 will not be able switch the time-variant voltage $V_{CC}$ from one level to another withing the defined temporal limit of 0.5 µs. As such, it is desirable to minimize the delay associated with generating the time-variant target voltage $V_{TGT}$ for the power management circuit 12.

Figure 2:
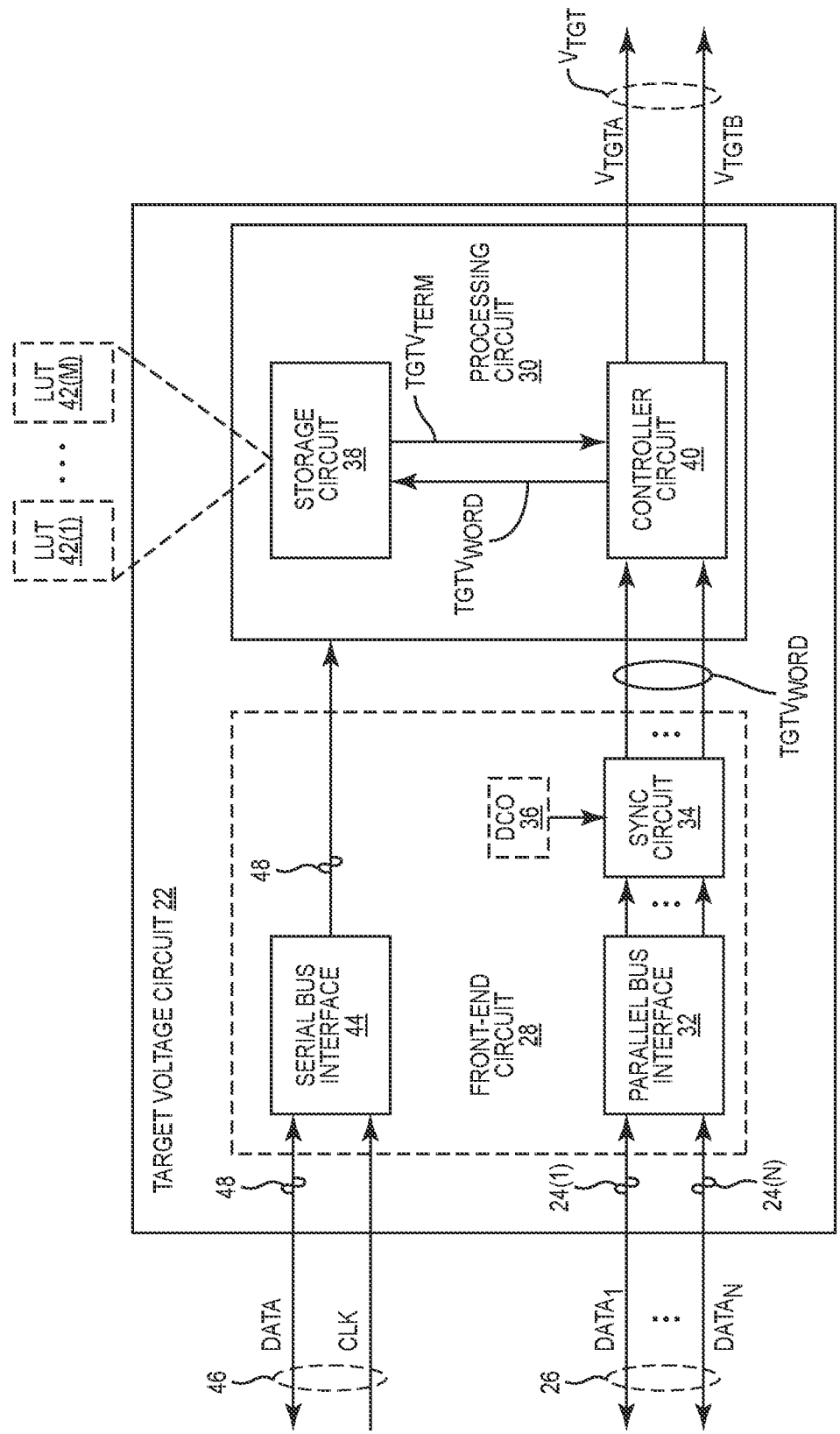
FIG. 2 is a schematic diagram of an exemplary target voltage circuit configured according to embodiments of the present disclosure to generate a target voltage(s) with minimum delay.

In this regard, FIG. 2 is a schematic diagram of an exemplary target voltage circuit 22 configured according to embodiments of the present disclosure to generate at least one target voltage $V_{TGT}$ with minimum delay. In embodiments disclosed herein, the target voltage circuit 22 is configured to receive a number of data signals 24(1)-24(N) via a parallel bus 26. In a non-limiting example, the parallel bus 26 can be a general-purpose input/output (GPIO) bus that includes a number of data lines $DATA_1$-$DATA_N$ each carrying a respective one of the data signals 24(1)-24(N).

Specifically, the data signals 24(1)-24(N) are generated to collectively represent a digital target voltage word $TGTV_{WORD}$ that includes N bits. Each of the N bits in the digital target voltage word $TGTV_{WORD}$ corresponds to a respective one of the data signals 24(1)-24(N). For example, if the parallel bus 26 includes three data lines $DATA_1$, $DATA_2$, $DATA_3$, then the digital target voltage word $TGTV_{WORD}$ will be a 3-bit digital word that can be encoded to represent eight different binary values "000," "001," "010," "011," "100," "101," "110," and "111." For the convenience of illustration, the digital target voltage word $TGTV_{WORD}$ will be discussed hereinafter as the 3-bit digital word. Understandably, the digital target voltage word $TGTV_{WORD}$ may include any number of digital bits, subject to the number of data lines $DATA_1$-$DATA_N$ in the parallel bus 26.

The target voltage circuit 22 is further configured to determine a target voltage term $TGTV_{TERM}$ based on the digital target voltage word $TGTV_{WORD}$ received via the parallel bus 26. As discussed in various embodiments below, the target voltage term $TGTV_{TERM}$ can be an offset relative to a known voltage or an actual value of the target voltage $V_{TGT}$. Accordingly, the target voltage circuit 22 can generate the target voltage $V_{TGT}$ based on the determined target voltage term $TGTV_{TERM}$.

In contrast to the power management circuit 12 in the conventional power management apparatus 10 of FIG. 1, which takes approximately 0.44 µs to receive the target voltage $V_{TGT}$, the target voltage circuit 22 can receive the digital target voltage word $TGTV_{WORD}$ and generate the target voltage $V_{TGT}$ in approximately 0.1 µs. As a result, as discussed later in FIG. 4, it is possible for a fast-switching power management circuit to switch an APT voltage based on the target voltage $V_{TGT}$ within the defined temporal limit (e.g., 0.5 µs).

In a non-limiting example, the target voltage circuit 22 includes a front-end circuit 28 and a processing circuit 30, which can be a field-programmable gate array (FPGA), as an example. The front-end circuit 28 may include a parallel bus interface circuit 32 and a synchronization circuit 34. The parallel bus interface circuit 32 is coupled to the parallel bus 26 to receive the data signals 24(1)-24(N) that represent the digital target voltage word $TGTV_{WORD}$. The synchronization circuit 34 is coupled to the parallel bus interface circuit 32 and configured to synchronously output the digital target voltage word $TGTV_{WORD}$ to the processing circuit 30. For example, the synchronization circuit 34 may help eliminate jitters associated with the data signals 24(1)-24(N) based on a local oscillator 36 (denoted as "DCO").

The processing circuit 30 may include a storage circuit 38 and a controller circuit 40. The storage circuit 38, which can include a variety of storage devices such as register, memory, solid-state disk (SSD), and so on, is configured to store one or more lookup tables (LUTs) 42(1)-42(M). As discussed in detail in FIGS. 3A and 3B, each of the LUTs 42(1)-42(M) is configured to map a number of voltage words $V_{WORD}$ to a number of voltage terms $V_{TERM}$, respectively.

The controller circuit 40 receives the digital target voltage word $TGTV_{WORD}$ from the synchronization circuit 34 and determines a selected one of the voltage words $V_{WORD}$ that matches the received digital target voltage word $TGTV_{WORD}$. Accordingly, the controller circuit 40 can determine the target voltage term $TGTV_{TERM}$ as a respective one of the voltage terms $V_{TERM}$ that maps to the selected one of the voltage words $TGTV_{WORD}$ that matches the received digital target voltage word $V_{WORD}$. Subsequently, the processing circuit 30 can generate the target voltage $V_{TGT}$ based on the target voltage term $TGTV_{TERM}$. In a non-limiting example, the processing circuit 30 can generate a first target voltage $V_{TGTA}$ and a second target voltage $V_{TGTB}$, as part of the target voltage $V_{TGT}$, all based on the target voltage term $TGTV_{TERM}$.

The front-end circuit 28 may also include a serial bus interface circuit 44 coupled to a serial bus 46. In a non-limiting example, the serial bus 46 can be an RFFE bus that includes a data line DATA and a clock line CLK. The serial bus 46 may be utilized to provide at least one configuration signal 48 to preload the LUTs 42(1)-42(M) into the storage circuit 38.

Figure 3A:
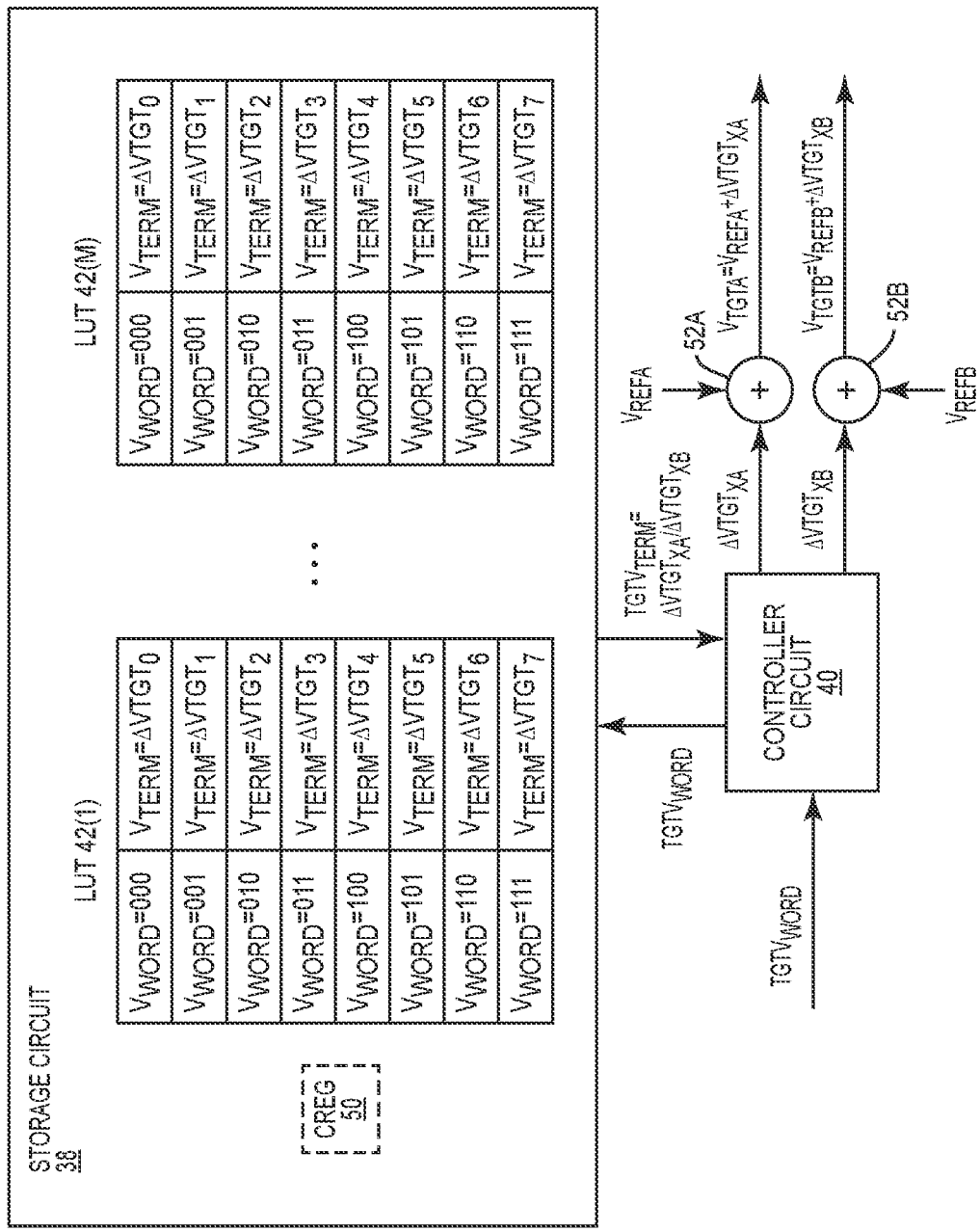
FIG. 3A is a schematic diagram of a processing circuit in the target voltage circuit of FIG. 2 configured to generate the target voltage(s) according to one embodiment of the present disclosure.

In one embodiment, the storage circuit 38 can be preloaded with multiple LUTs wherein each of the voltage terms $V_{TERM}$ represents a voltage offset relative to a known voltage. In this regard, FIG. 3A is a schematic diagram of the processing circuit 30 in the target voltage circuit 22 of FIG. 2 configured according to one embodiment of the present disclosure. Common elements between FIGS. 2 and 3A are shown therein with common element numbers and will not be re-described herein.

As shown in FIG. 3A, the storage circuit 38 is preloaded with the LUTs 42(1)-42(M) (M>1), each storing different contents. In this regard, it is possible to provide more granularity in terms of the voltage offsets without having to increase the number of the data lines $DATA_1$-$DATA_N$ in the parallel bus 26. To help the controller circuit 40 determine which of the LUTs 42(1)-42(M), the storage circuit 38 may be configured to further include a configuration register 50 (denoted as "CREG") configured to indicate a selected LUT among the LUTs 42(1)-42(M) to be used by the controller circuit 40 for determining the target voltage term $TGTV_{TERM}$. In a non-limiting example, the configuration register 50 can be set via the configuration signal 48 received via the serial bus 46, either statically or dynamically.

In one non-limiting example, each of the voltage terms $V_{TERM}$ in each of the LUTs 42(1)-42(M) can be configured to represent a respective one of a number of positive target voltage offsets $\Delta VTGT_0$-$\Delta VTGT_7$. In this regard, the controller circuit 40 is configured to determine the selected one of the voltage words $V_{WORD}$ in the selected LUT among the LUTs 42(1)-42(M) that matches the received digital target voltage word $TGTV_{WORD}$. Accordingly, the controller circuit 40 determines the target voltage term $TGTV_{TERM}$ as a respective one of the positive target voltage offsets $\Delta VTGT_0$-$\Delta VTGT_7$ (denoted as "$\Delta VTGT_{XA}$" and/or "$\Delta VTGT_{XB}$") in the selected LUT that maps to the selected one of the voltage words $V_{WORD}$.

In one embodiment, the control circuit 40 may select the positive target voltage offsets $\Delta VTGT_{XA}$ and $VTGT_{XB}$ from a same one of the LUTs 42(1)-42(M) based on the received digital target voltage word $TGTV_{WORD}$. In this regard, the positive target voltage offset $\Delta VTGT_{XA}$ will be the same as the positive target voltage offset $\Delta VTGT_{XB}$. In another embodiment, the control circuit 40 may select the positive target voltage offsets $\Delta VTGT_{XA}$ and $VTGT_{XB}$ from a different one of the LUTs 42(1)-42(M) based on the received digital target voltage word $TGTV_{WORD}$. In this regard, the positive target voltage offset $\Delta VTGT_{XA}$ will be different from the positive target voltage offset $\Delta VTGT_{XB}$.

The processing circuit 30 may include a first combiner 52A and a second combiner 52B. The first combiner 52A is configured to add the target voltage term $TGTV_{TERM}$ with a first reference voltage $V_{REFA}$ to generate the first target voltage $V_{TGTA}$ ($V_{TGTA} = V_{REFA} + \Delta VTGT_{XA}$). Likewise, the second combiner 52B is configured to add the target voltage term $TGTV_{TERM}$ with a second reference voltage $V_{REFB}$ to generate the second target voltage $V_{TGTB}$ ($V_{TGTB} = V_{REFB} + \Delta VTGT_{XB}$). The first reference voltage $V_{REFA}$ and the second reference voltage $V_{REFB}$, which may be identical or different, can be set via the serial bus 46 either statically or dynamically. Notably, the processing circuit 30 may be configured to include additional combiners to concurrently generate additional target voltages based on the same target voltage term $TGTV_{TERM}$.

In another non-limiting example, each of the voltage terms $V_{TERM}$ in each of the LUTs 42(1)-42(M) can be configured to represent a respective one of a number of positive/negative target voltage offsets $\Delta VTGT_0$-$\Delta VTGT_7$. In this regard, the controller circuit 40 is configured to determine the selected one of the voltage words $V_{WORD}$ in the selected LUT among the LUTs 42(1)-42(M) that matches the received digital target voltage word $TGTV_{WORD}$. Accordingly, the controller circuit 40 determines the target voltage term $TGTV_{TERM}$ as a respective one of the positive/negative target voltage offsets $\Delta VTGT_0$-$\Delta VTGT_7$ (denoted as "$\Delta VTGT_X$") in the selected LUT that maps to the selected one of the voltage words $V_{WORD}$.

In this regard, instead of adding the target voltage term $TGTV_{TERM}$ with the first reference voltage $V_{REFA}$ to generate the first target voltage $V_{TGTA}$, the first combiner 52A may be configured to instead add the target voltage term $TGTV_{TERM}$ with a previously generated first target voltage $V_{TGTA}$ to generate the new first target voltage $V_{TGTA}$. Likewise, the second combiner 52B may be configured to instead add the target voltage term $TGTV_{TERM}$ with a previously generated second target voltage $V_{TGTB}$ to generate the new second target voltage $V_{TGTB}$.

Figure 3B:
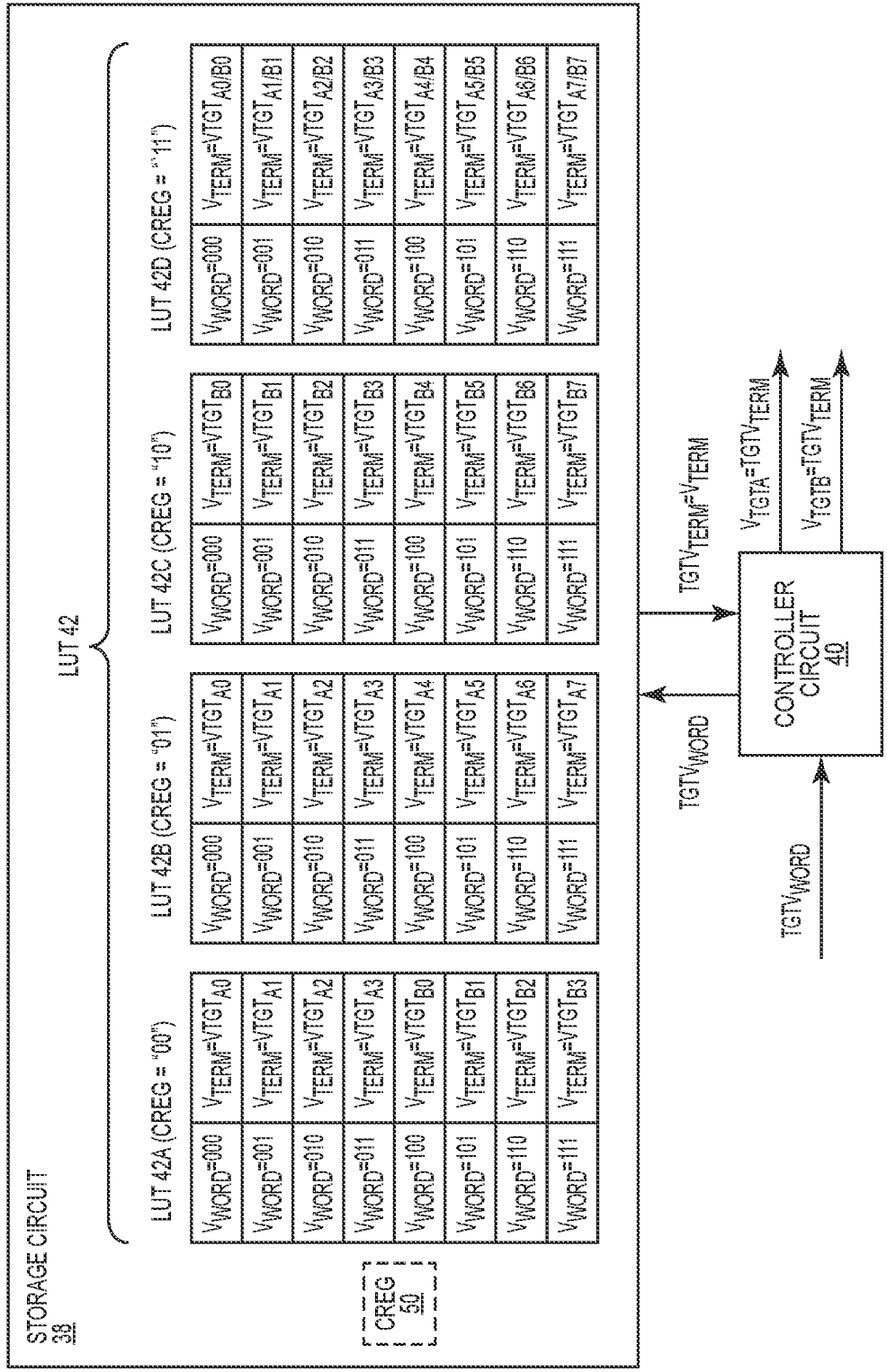
FIG. 3B is a schematic diagram of a processing circuit in the target voltage circuit of FIG. 2 configured to generate the target voltage(s) according to another embodiment of the present disclosure.

In another embodiment, the storage circuit 38 can be preloaded with a single LUT 42 wherein each of the voltage terms $V_{TERM}$ represents an actual target voltage. In this regard, FIG. 3B is a schematic diagram of the processing circuit 30 in the target voltage circuit 22 of FIG. 2 configured according to another embodiment of the present disclosure. Common elements between FIGS. 2, 3A, and 3B are shown therein with common element numbers and will not be re-described herein.

In a non-limiting example, the configuration register 50 is further configured to indicate how the controller circuit 40 should interpret the LUT 42. For example, the configuration register 50 can include a 2-bit flag encoded as "00," "01," "10," or "11."

In this regard, if the 2-bit flag is set to "00," the controller circuit 40 will interpret the LUT 42 as LUT 42A. Accordingly, if the received digital target voltage word $TGTV_{WORD}$ is "000," "001," "010," or "011," the controller circuit 40 will select one of the voltage terms $VTGT_{A0}$, $VTGT_{A1}$, $VTGT_{A2}$, and $VTGT_{A3}$ as the target voltage term $TGTV_{TERM}$ and output the target voltage term $TGTV_{TERM}$ as the first target voltage $V_{CCA}$. In contrast, if the received digital target voltage word $TGTV_{WORD}$ is "100," "101," "110," or "111," the controller circuit 40 will select one of the voltage terms $VTGT_{B0}$, $VTGT_{B1}$, $VTGT_{B2}$, and $VTGT_{B3}$ as the target voltage term $TGTV_{TERM}$ and output the target voltage term $TGTV_{TERM}$ as the second target voltage $V_{CCB}$.

If the 2-bit flag is set to "01," the controller circuit 40 will interpret the LUT 42 as LUT 42B. Accordingly, the controller circuit 40 will select one of the voltage terms $VTGT_{A0}$, $VTGT_{A1}$, $VTGT_{A2}$, $VTGT_{A3}$, $VTGT_{A4}$, $VTGT_{A5}$, $VTGT_{A6}$, and $VTGT_{A7}$ that matches the received digital target voltage word $TGTV_{WORD}$ as the target voltage term $TGTV_{TERM}$ and output the target voltage term $TGTV_{TERM}$ as the first target voltage $V_{TGTA}$.

If the 2-bit flag is set to "10," the controller circuit 40 will interpret the LUT 42 as LUT 42C. Accordingly, the controller circuit 40 will select one of the voltage terms $VTGT_{B0}$, $VTGT_{B1}$, $VTGT_{B2}$, $VTGT_{B3}$, $VTGT_{B4}$, $VTGT_{B5}$, $VTGT_{B6}$, and $VTGT_{B7}$ that matches the received digital target voltage word $TGTV_{WORD}$ as the target voltage term $TGTV_{TERM}$ and output the target voltage term $TGTV_{TERM}$ as the second target voltage $V_{TGTB}$.

If the 2-bit flag is set to "11," the controller circuit 40 will interpret the LUT 42 as LUT 42D. Accordingly, the controller circuit 40 will select one of the voltage terms $VTGT_{A0/B0}$, $VTGT_{A1/B1}$, $VTGT_{A2/B2}$, $VTGT_{A3/B3}$, $VTGT_{A4/B4}$, $VTGT_{A5/B5}$, $VTGT_{A6/B6}$, and $VTGT_{A7/B7}$ that matches the received digital target voltage word $TGTV_{WORD}$ as the target voltage term $TGTV_{TERM}$ and output the target voltage term $TGTV_{TERM}$ as the first target voltage $V_{TGTA}$ and/or the second target voltage $V_{TGTB}$.

Figure 4:
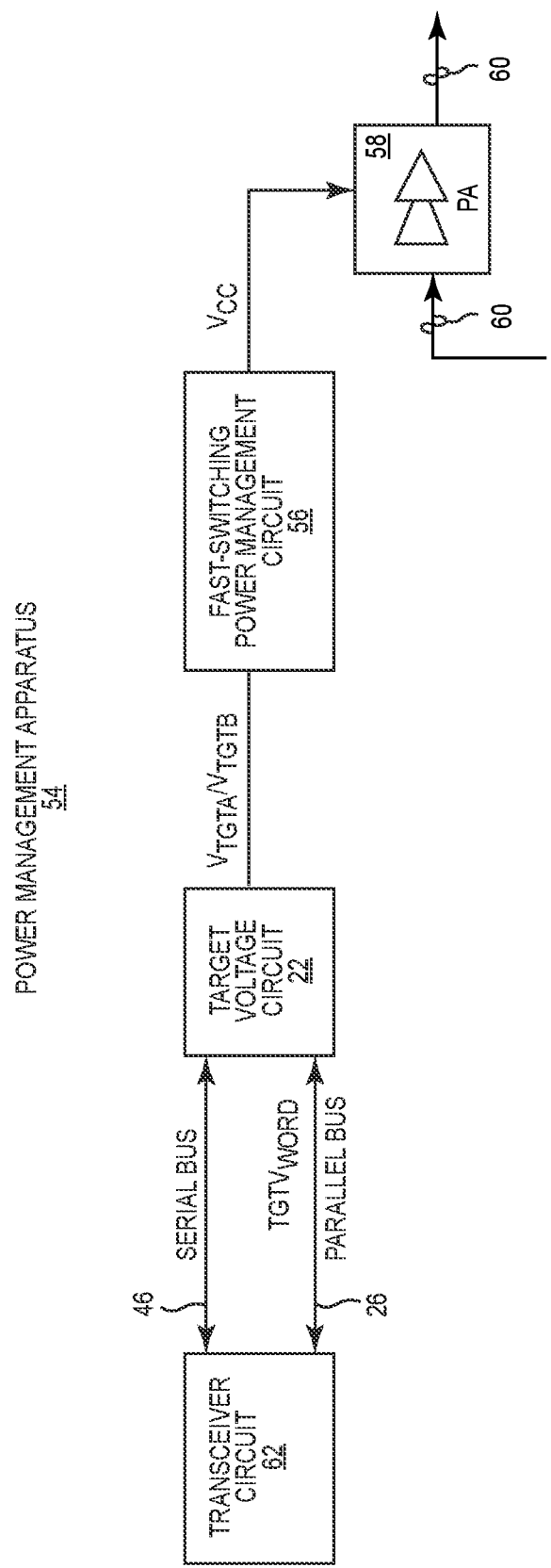
FIG. 4 is a schematic diagram of an exemplary power management apparatus configured to enable fast voltage changes by employing the target voltage circuit of FIG. 2.

As discussed above, the target voltage circuit 22 is able to significantly reduce the delay associated with generating the target voltage $V_{CC}$. As such, it is possible to provide the target voltage circuit 22 in a power management apparatus to enable fast voltage changes. In this regard, FIG. 4 is a schematic diagram of an exemplary power management apparatus 54 configured to enable fast voltage changes by employing the target voltage circuit 22 of FIG. 2. Common elements between FIGS. 2 and 4 are shown therein with common element numbers and will not be re-described herein.

The power management apparatus 54 includes a fast-switching power management circuit 56 configured to generate an APT voltage $V_{CC}$ based on the first target voltage $V_{TGTA}$ and/or the second target voltage $V_{TGTB}$ generated by the target voltage circuit 22. Specifically, the fast-switching power management circuit 56 is capable of switching the APT voltage $V_{CC}$ between different voltage levels within a defined temporal limit (e.g., 0.5 μs) based on the first target voltage $V_{TGTA}$ and/or the second target voltage $V_{TGTB}$. For a detailed description of the fast-switching power management circuit 56, please refer to U.S. patent application Ser. No. 17/217,654, entitled "POWER MANAGEMENT CIRCUIT FOR FAST AVERAGE POWER TRACKING VOLTAGE SWITCHING."

The power management apparatus 54 includes a power amplifier circuit 58 configured to amplify an RF signal 60 based on the APT voltage $V_{CC}$. The RF signal 60 may be generated by a transceiver circuit 62. The transceiver circuit 62 may be coupled to the target voltage circuit 22 via the parallel bus 26 and the serial bus 46. In this regard, the transceiver circuit 62 may provide the digital target voltage word $TGTV_{WORD}$ to the target voltage circuit 22 via the parallel bus 26.

Those skilled in the art will recognize improvements and modifications to the preferred embodiments of the present disclosure. All such improvements and modifications are considered within the scope of the concepts disclosed herein and the claims that follow.

What is claimed is:

1. A target voltage circuit comprising:
a front-end circuit configured to receive a plurality of data signals collectively representing a digital target voltage word; and
a processing circuit configured to:
determine a target voltage term based on the received digital target voltage word; and
generate at least one target voltage based on the determined target voltage term.

2. The target voltage circuit of claim 1 wherein the front-end circuit comprises a parallel bus interface circuit configured to receive the plurality of data signals via a parallel bus.

3. The target voltage circuit of claim 2 wherein the front-end circuit further comprises a synchronization circuit coupled to the parallel bus interface circuit and configured to synchronously output the digital target voltage word to the processing circuit.

4. The target voltage circuit of claim 2 wherein the parallel bus comprises a general-purpose input/output (GPIO) bus, the GPIO bus comprising a plurality of data lines each configured to carry a respective one of the plurality of data signals.

5. The target voltage circuit of claim 1 wherein the processing circuit comprises:
a storage circuit configured to store one or more lookup tables (LUTs) each configured to map a plurality of voltage words to a plurality of voltage terms, respectively; and
a controller circuit configured to:
determine a selected LUT among the one or more LUTs;
determine a selected one of the plurality of voltage words in the selected LUT that matches the digital target voltage word; and
determine the target voltage term as a respective one of the plurality of voltage terms in the selected LUT that maps to the selected one of the plurality of voltage words.

6. The target voltage circuit of claim 5 wherein the plurality of voltage terms each represents a respective one of a plurality of positive target voltage offsets.

7. The target voltage circuit of claim 6 wherein the processing circuit is further configured to:
determine the selected one of the plurality of voltage words in the selected LUT that matches the digital target voltage word;
determine the target voltage term as a respective one of the plurality of positive target voltage offsets in the selected LUT that maps to the selected one of the plurality of voltage words; and
add the target voltage term to a reference voltage to generate the at least one target voltage.

8. The target voltage circuit of claim 5 wherein the plurality of voltage terms each represents a respective one of a plurality of positive/negative target voltage offsets.

9. The target voltage circuit of claim 8 wherein the processing circuit is further configured to:
determine the selected one of the plurality of voltage words in the selected LUT that matches the digital target voltage word;
determine the target voltage term as a respective one of the plurality of positive/negative target voltage offsets in the selected LUT that maps to the selected one of the plurality of voltage words; and
add the target voltage term to a previously generated target voltage to generate the at least one target voltage.

10. The target voltage circuit of claim 5 wherein the plurality of voltage terms each represents a respective one of a plurality of target voltages.

11. The target voltage circuit of claim 10 wherein the processing circuit is further configured to:
determine the selected one of the plurality of voltage words in the selected LUT that matches the digital target voltage word;
determine the target voltage term as a respective one of the plurality of target voltages in the selected LUT that maps to the selected one of the plurality of voltage words; and
output the target voltage term as the at least one target voltage.

12. The target voltage circuit of claim 5 wherein the storage circuit comprises a configuration register configured to indicate the selected LUT.

13. The target voltage circuit of claim 12 wherein the front-end circuit comprises a serial bus interface coupled to a serial bus and configured to:
receive at least one configuration signal via the serial bus; and
program the one or more LUTs and the configuration register based on the at least one configuration signal.

14. The target voltage circuit of claim 13 wherein the serial bus comprises a radio frequency front-end (RFFE) bus.

15. The target voltage circuit of claim 12 wherein:
the configuration register is further configured to indicate how to interpret each of the one or more LUTs; and
the processing circuit is further configured to interpret the plurality of voltage words and the plurality of voltage terms in each of the one or more LUTs as indicated by the configuration register.

16. A power management apparatus comprising:
a target voltage circuit comprising:
a front-end circuit configured to receive a plurality of data signals collectively representing a digital target voltage word; and
a processing circuit configured to:
determine a target voltage term based on the received digital target voltage word; and
generate at least one target voltage based on the determined target voltage term; and
a fast-switching power management circuit configured to switch an average power tracking (APT) voltage between different voltage levels based on the at least one target voltage and within a defined temporal limit.

17. The power management apparatus of claim 16 wherein the front-end circuit comprises a parallel bus interface circuit configured to receive the plurality of data signals via a parallel bus.

18. The power management apparatus of claim 17 wherein the processing circuit comprises:
a storage circuit configured to store one or more lookup tables (LUTs) each configured to map a plurality of voltage words to a plurality of voltage terms, respectively; and
a controller circuit configured to:
determine a selected LUT among the one or more LUTs;

determine a selected one of the plurality of voltage words in the selected LUT that matches the digital target voltage word; and determine the target voltage term as a respective one of the plurality of voltage terms in the selected LUT that maps to the selected one of the plurality of voltage words.

19. The power management apparatus of claim 18 wherein the front-end circuit comprises a serial bus interface coupled to a serial bus and configured to:

receive at least one configuration signal via the serial bus; and program the one or more LUTs based on the at least one configuration signal.

20. The power management apparatus of claim 19 wherein the target voltage circuit is coupled to a transceiver circuit via the parallel bus and the serial bus.

* * * * *